United States Patent [19]

Bazes

[11] Patent Number: 4,994,695

[45] Date of Patent: Feb. 19, 1991

[54] SYNCHRONOUS DELAY LINE WITH QUADRATURE CLOCK PHASES

[75] Inventor: Mel Bazes, Haifa, Israel

[73] Assignee: Intel Corporation, Santa Clara, Calif.

[21] Appl. No.: 434,408

[22] Filed: Nov. 13, 1989

[51] Int. Cl.$^5$ .......................... H03K 5/13; H03K 7/00
[52] U.S. Cl. ..................................... 307/602; 307/606; 307/603; 307/605; 328/63
[58] Field of Search ............... 307/602, 603, 605, 606, 307/595, 596; 528/55, 56; 377/76

[56] References Cited

U.S. PATENT DOCUMENTS 4,675,612 6/1987 Adams et al. .......................... 328/55

Primary Examiner—Stanley D. Miller

Attorney, Agent, or Firm—Blakely, Sokoloff, Taylor & Zafman

[57] ABSTRACT

A synchronous delay line with quadrature clock phases provides for an improved output from the taps of a delay line. The delay line is comprised of a phase generator, a plurality of voltage controlled delay stages arranged serially, wherein the last VCD stage is coupled to a sample-and-hold circuit for providing an analog control voltage for controlling the delay. The phase generator generates in-phase clock signals to the interior delay stages, but provides quadrature clock phases to the delay stages at the extremities of the delay line. The quadrature clock phases provide for the low and high times of the tap outputs near the extremities of the synchronous delay line to be sufficiently long in duration for use in MOS circuits.

18 Claims, 7 Drawing Sheets

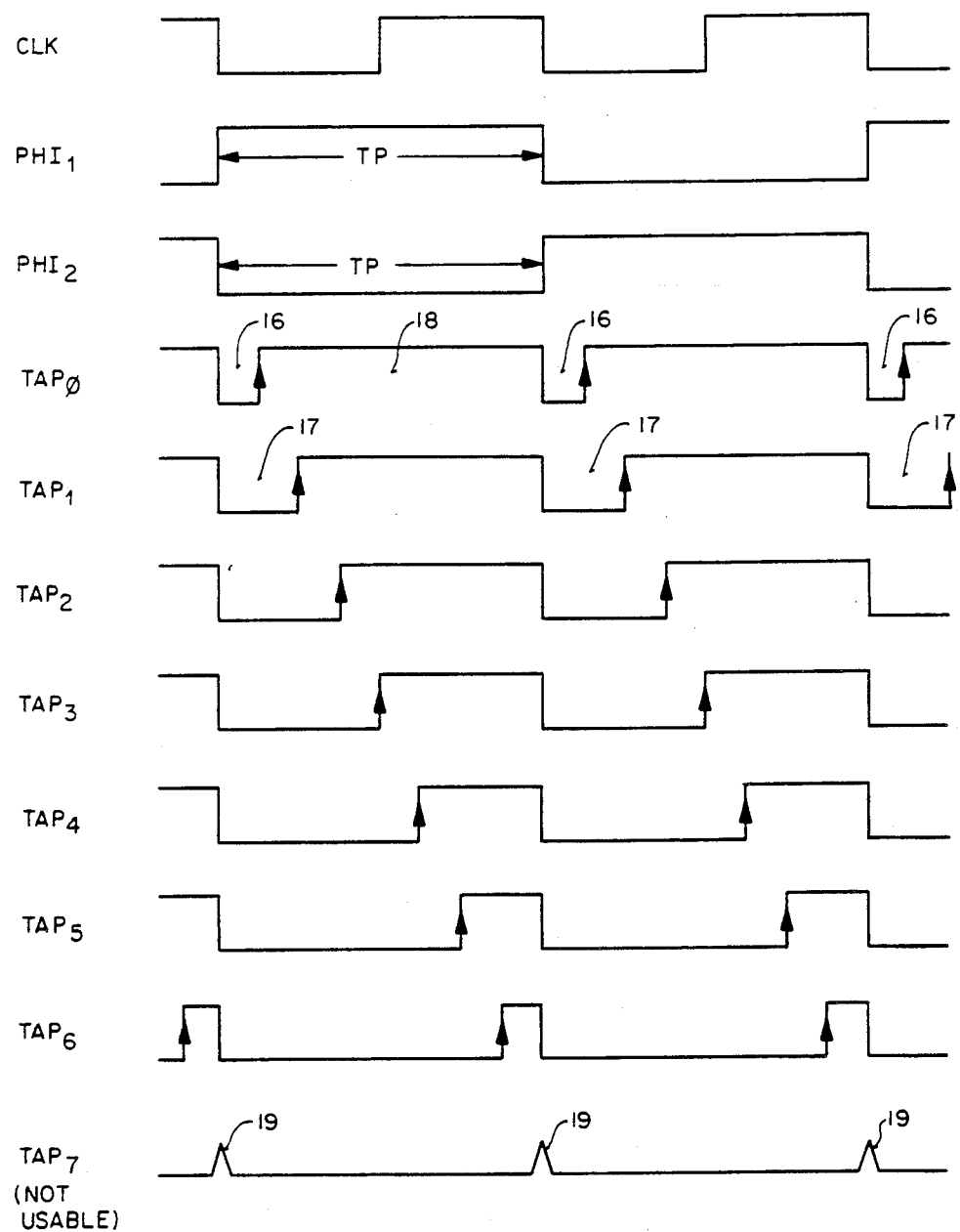
FIG_2 (PRIOR ART)

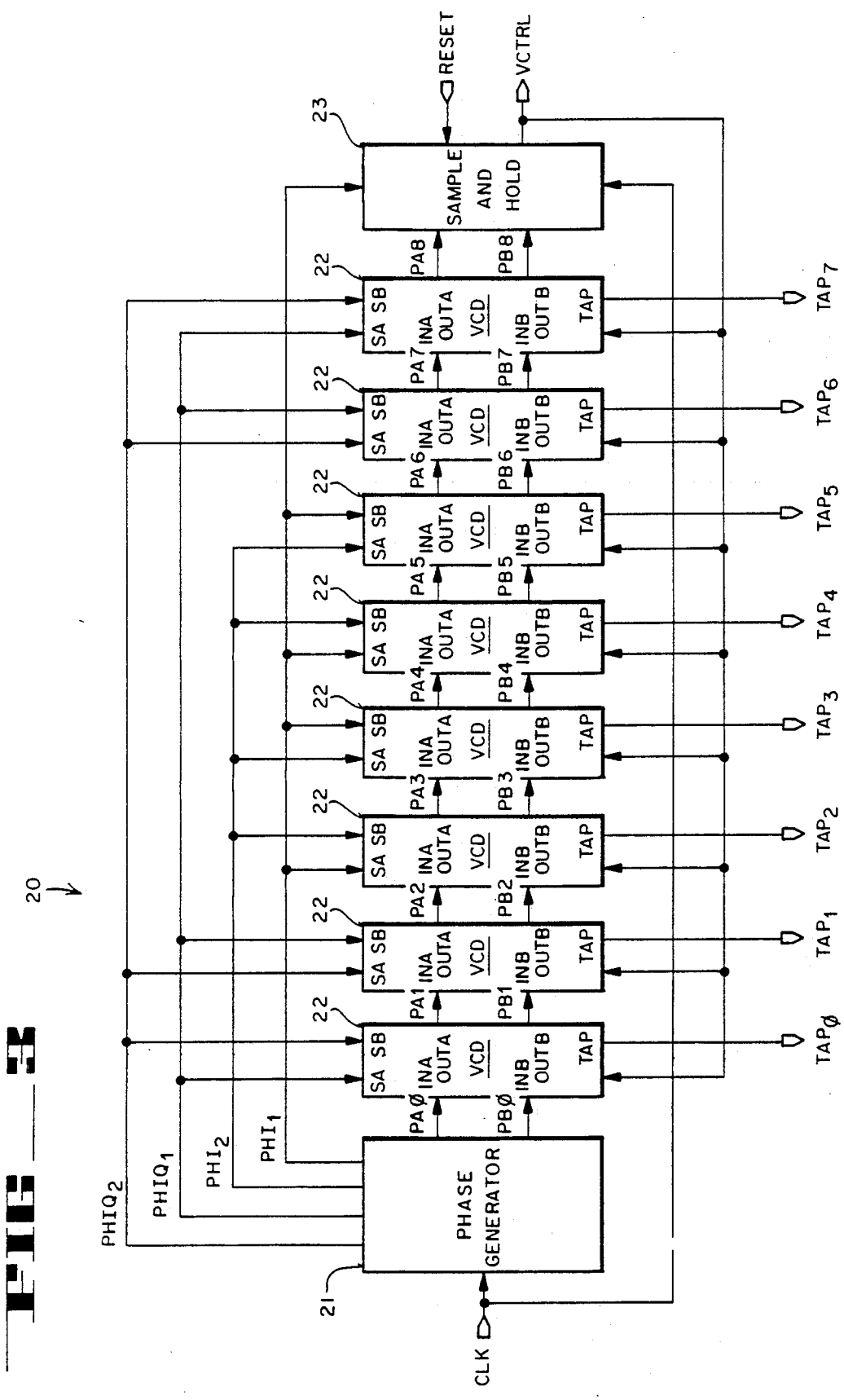
FIG—3

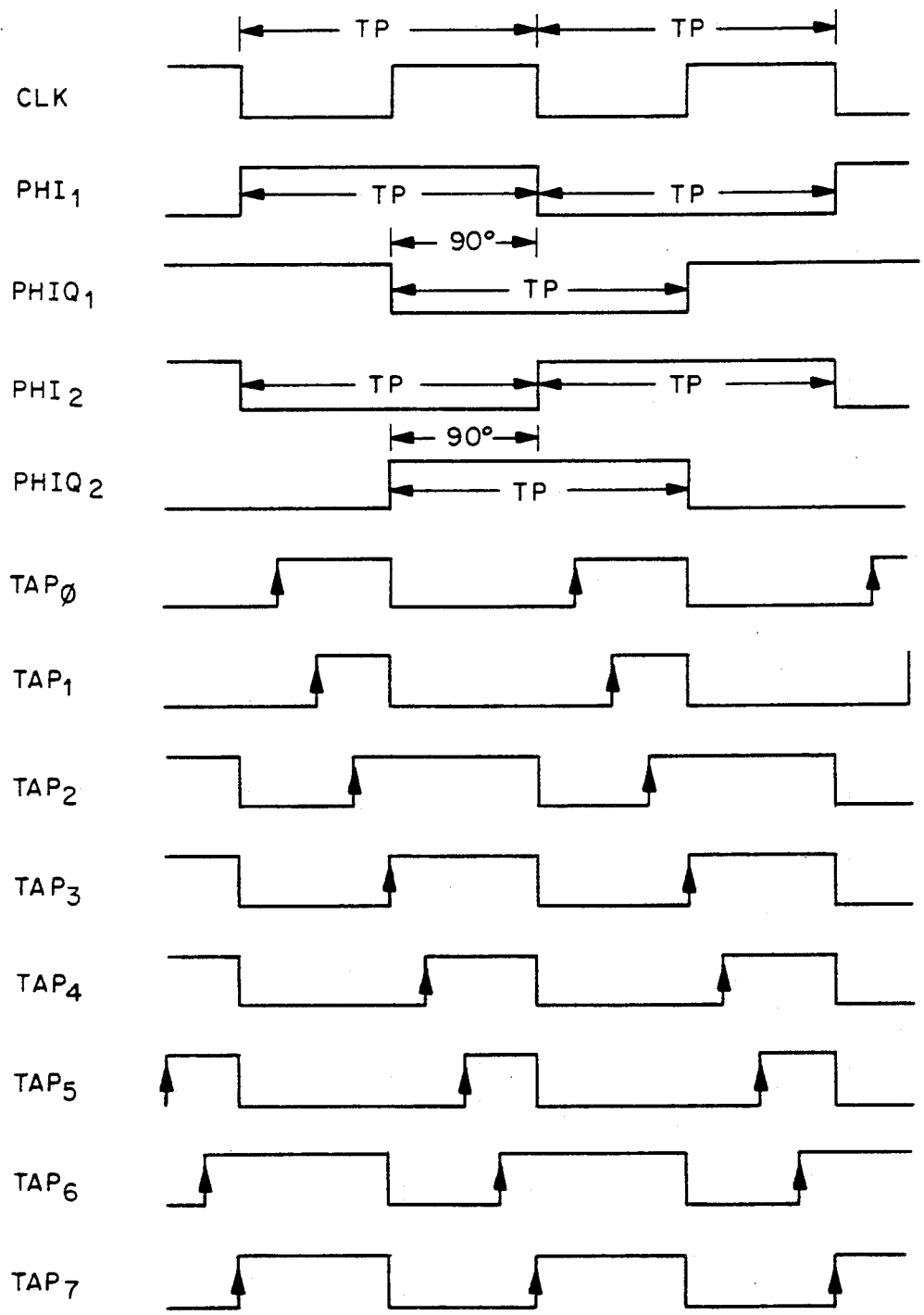
FIG_4

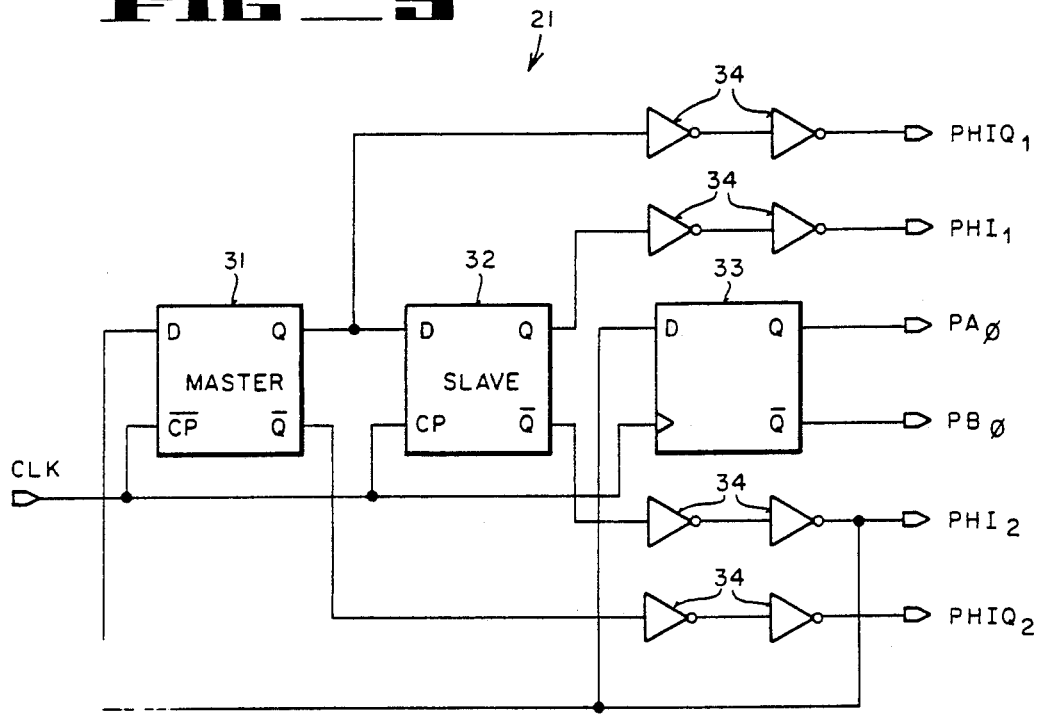
FIG_5
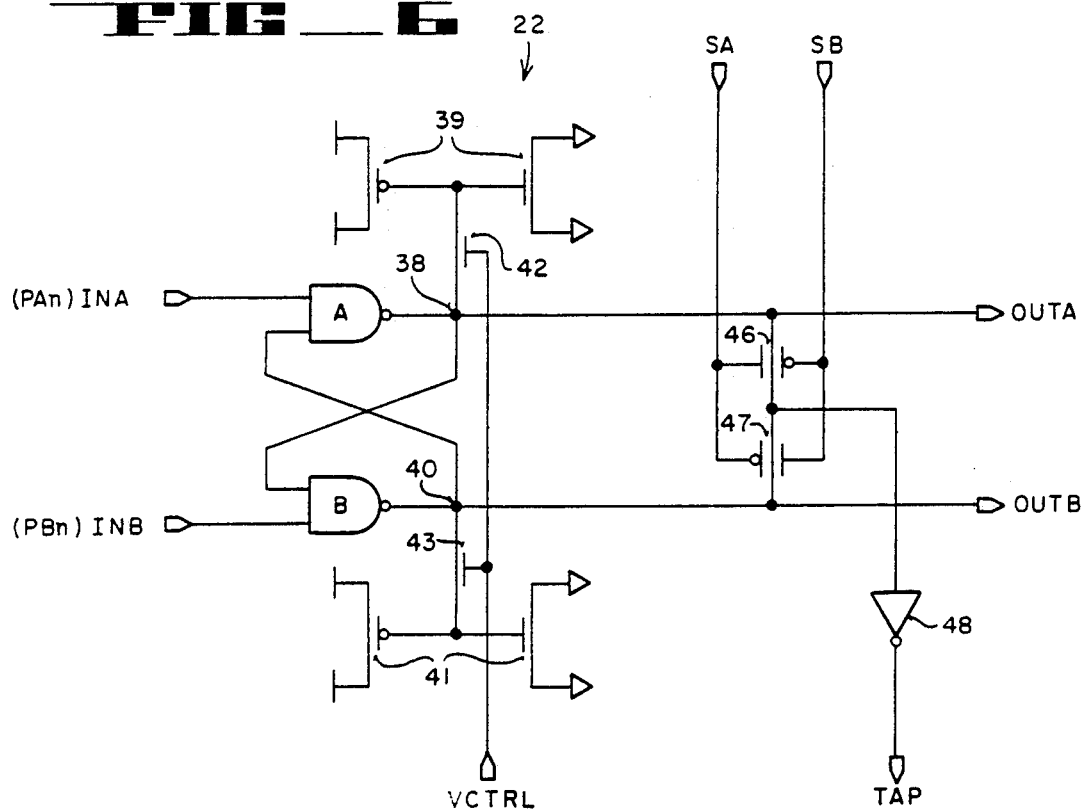
FIG_6

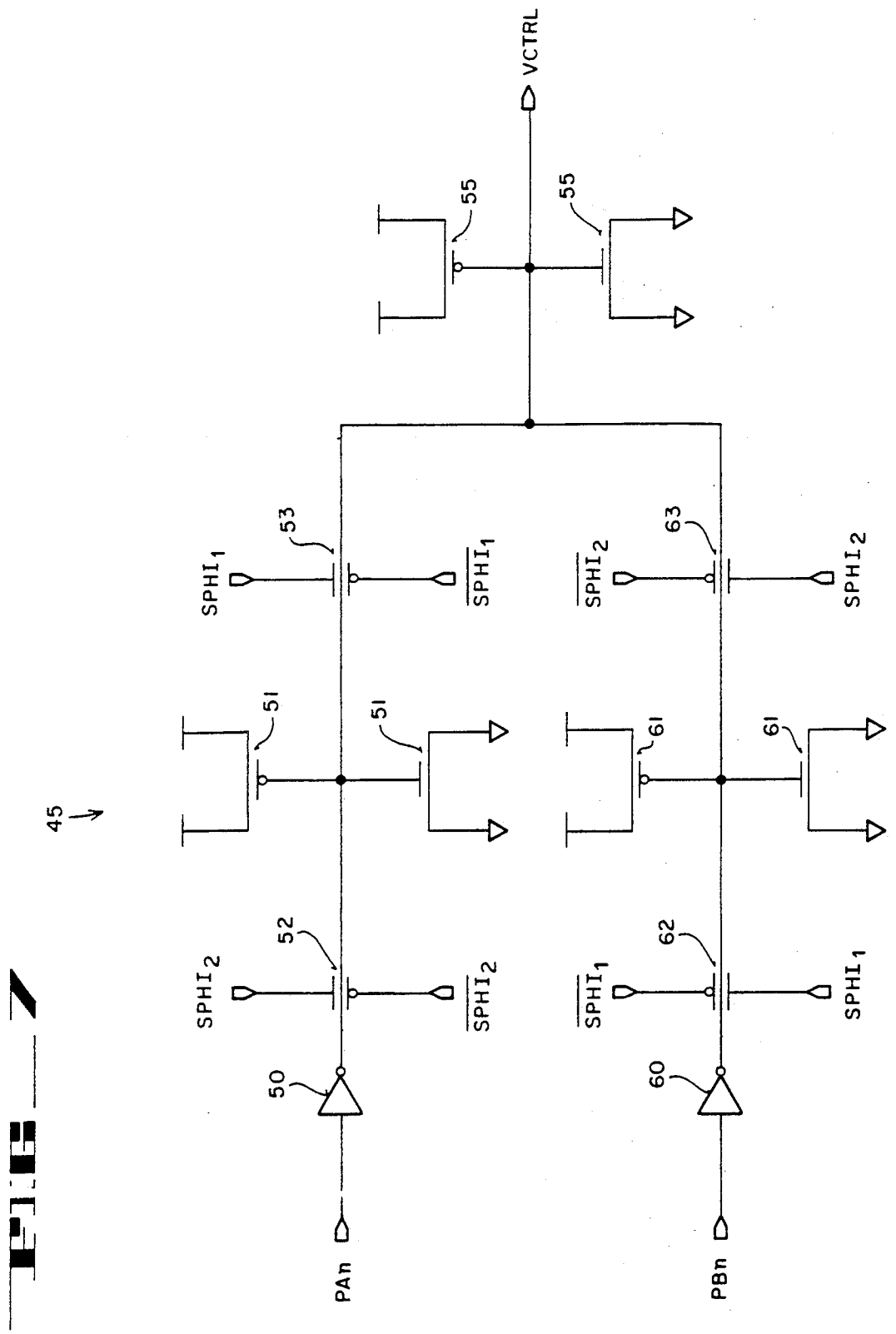

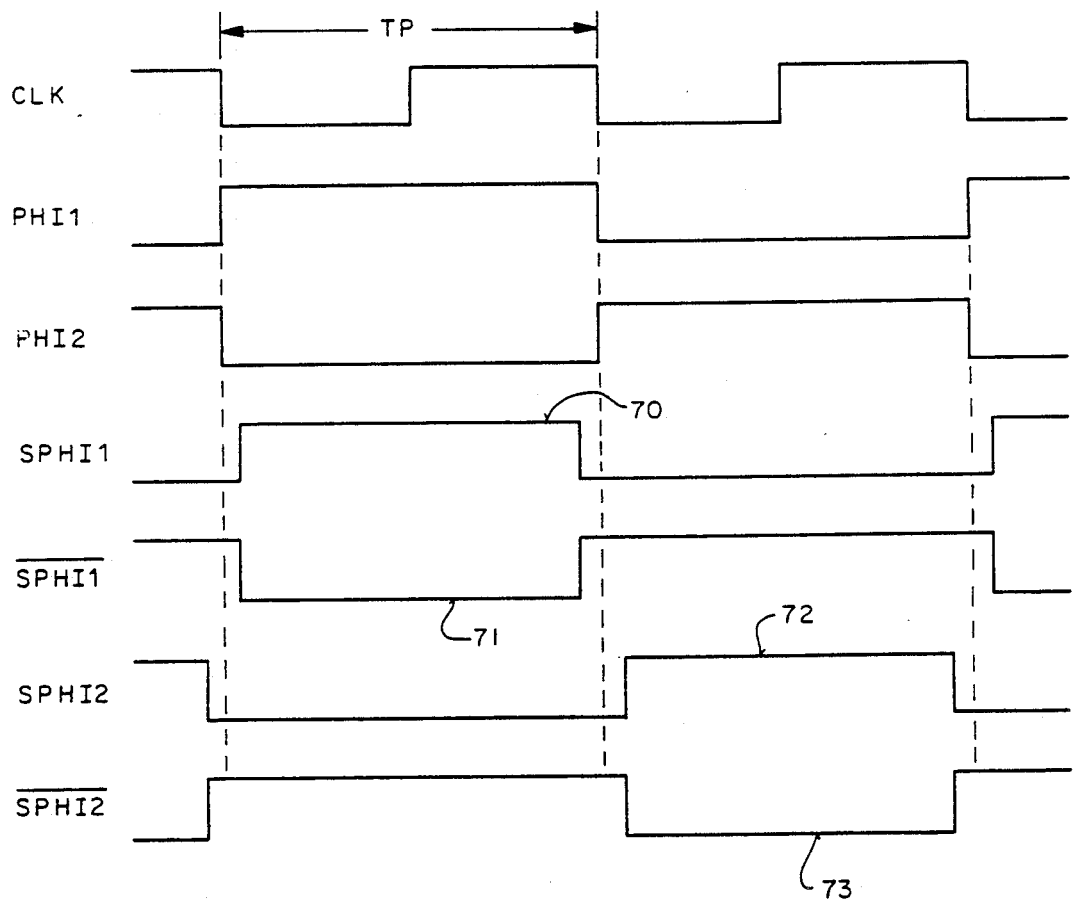

SYNCHRONOUS DELAY LINE WITH QUADRATURE CLOCK PHASES

BACKGROUND OF THE INVENTION

1. Field of the Invention

The present invention relates to the field of generation of timing pulses having precise delays and more particularly to synchronous delay lines as used in metal-oxide-semiconductor (MOS) integrated circuits.

2. Related Application

This application is related to copending application, Ser. No. 434,340, filed 11/13/89 and entitled "Synchronous Delay Line with Automatic Reset".

3. Prior Art

In an integrated circuit, having memory, processor, and/or other circuitry, it is necessary to have clocking or timing signals for various uses, such as latching of address signals, decoding the address signals and etc. One technique of generating "on-chip" timing signals is by the use of a synchronous delay line. Prior art techniques of utilizing a synchronous delay line are described in U.S. Pat. No. 4,496,861 entitled "Integrated Circuit Synchronous Delay Line" and in an article entitled "A Novel Precision MOS Synchronous Delay Line", IEEE Journal of Solid State Circuits, Volume SC-20, pp. 1265-1271, December 1985. The synchronous delay line is used to generate timing pulses designed to have precise delays from the start of a clock period. This particular synchronous delay line receives a clock reference signal and provides a series of taps, wherein each tap provides a timing pulse that has a precise delay from the commencement of a clock cycle which is initiated by the reference clock.

Although the synchronous delay line described in the above-mentioned prior art reference provides for on-chip timing signals having very high timing accuracy and which is also insensitive to variations due to processing, supply voltage and temperature, it has a disadvantage in that taps which are at or near either end of the synchronous delay line tend to have duty cycles which are either very small or very large in comparison to taps which are toward the interior of the synchronous delay line. Therefore, with the use of the prior art synchronous delay line as disclosed in U.S. Pat. No. 4,496,861, taps at or toward either end of the synchronous delay line are generally not usable for the purpose of generating delay signals.

As will be seen, the present invention provides for an improvement in which quadrature clock phases are utilized in order to effectively use the taps toward either end of the synchronous delay line.

SUMMARY OF THE INVENTION

An integrated circuit synchronous delay line for generating an arbitrary number of delayed signals synchronized with and delayed from a reference clock signal is described. A plurality of series-coupled voltage-controlled delay stages are employed, wherein each of the stages provides a controlled delay and an output coincident to the controlled delay. The first delay stage is coupled to receive clocking signals from a phase generator, and subsequent delay stages are coupled sequentially to receive the clocking signals from the previous delay stage. The final delay stage provides an output to a sample-and-hold circuit, which outputs a voltage that is then fed back to the delay stages for the purpose of providing the proper delay.

In order to provide useable delayed outputs from the delay stages at the extremities of the synchronous delay line, a quadrature clock phasing technique is used to clock the various delay stages. The phase generator provides two complementary clock phases which are synchronized and in phase with the reference clock. Two other complementary clock phasing signals are also generated by the phase generator; however, these quadrature-phase signals are out of phase with the first pair of clock signals by approximately 90°. The in-phase signals are provided to the interior delay stages, while the quadrature-phase signals are provided to the exterior delay stages of the synchronous delay line. By using the quadrature-phase signals to drive the delay stages at the extreme edges of the synchronous delay line, taps at these extremities provide output signals which do not have a significant disparity between the positive and negative going portions of the waveform.

In the preferred embodiment the various phasing signals are provided from a pair of master-slave flip-flop circuits. Each of the delay stages includes a pair of cross-coupled gates, wherein the clock phasing signals provide the control for outputting the delayed signal as a tap output from that delayed stage. The sample-and-hold circuit of the preferred embodiment operates in synchronism with the reference signal, wherein charge-sharing between a pair of capacitive device controls a value of an analog voltage for use as a feedback voltage in controlling the delays of the stages.

BRIEF DESCRIPTION OF THE DRAWINGS

FIG. 2 is a waveform diagram showing a waveform comparison of the various taps of the delay line of FIG. 1.

FIG. 3 is a block diagram schematic of a synchronous delay line of the present invention using quadrature clock phases in addition to the in-phase clock phases.

FIG. 4 is a waveform diagram showing a waveform comparison of the various taps of the delay line of FIG. 3.

FIG. 5 is a circuit schematic diagram of a phase generator of the preferred embodiment.

FIG. 6 is a circuit schematic diagram of a delay stage of the preferred embodiment.

FIG. 7 is a circuit schematic diagram of a portion of a sample-and-hold circuit of the preferred embodiment.

FIG. 8 is a waveform diagram showing the phasing waveforms used in the sample-and-hold circuit of the preferred embodiment.

DETAILED DESCRIPTION OF THE PRESENT INVENTION

Figure 1:
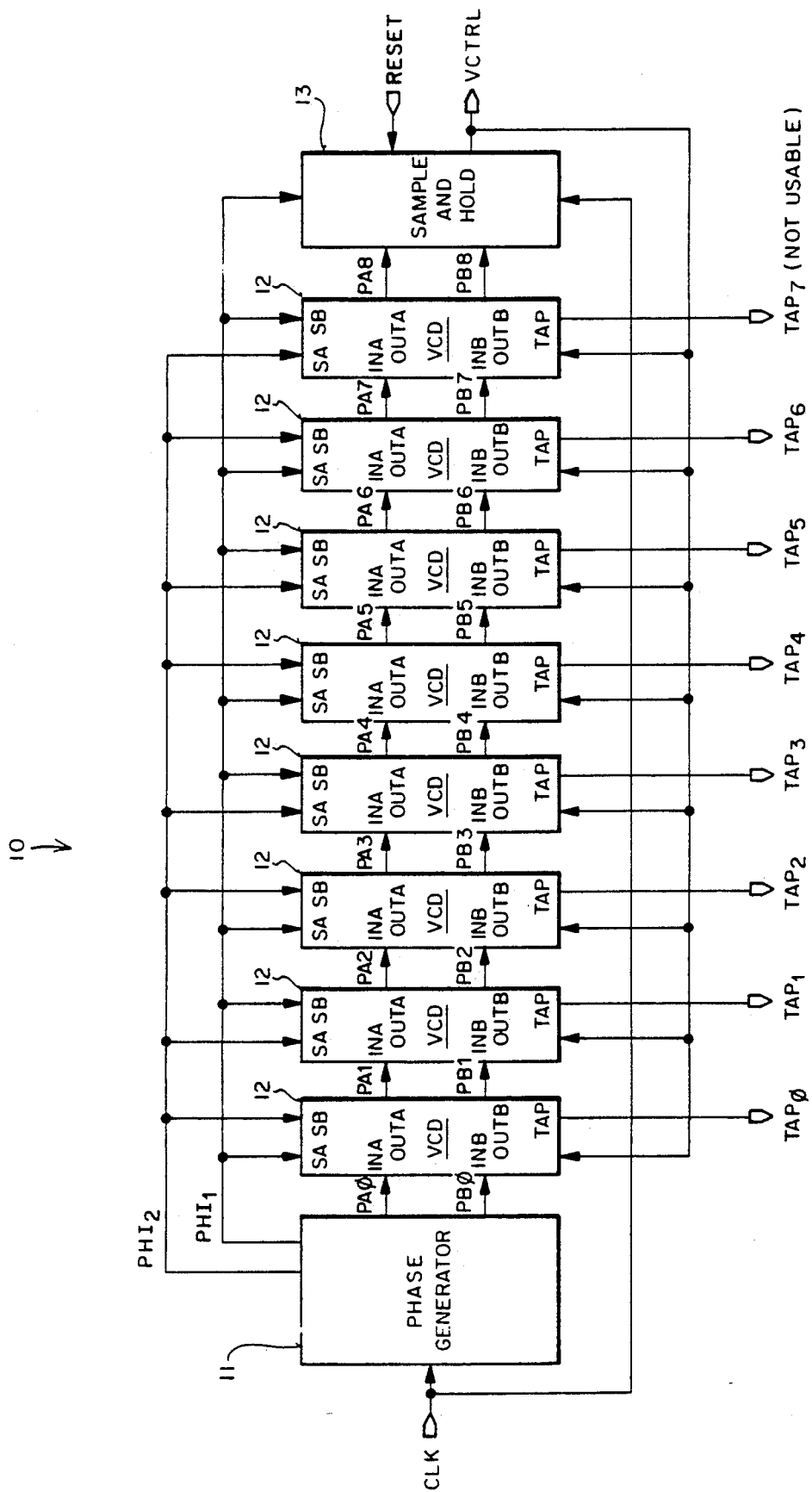
FIG. 1 is a block diagram schematic showing a prior art synchronous delay line using in-phase clocking signals.

A precision synchronous delay line which uses quadrature clock phases for the purpose of effectively using all of the taps of the delay line for generating clock signals at prescribed intervals is described. In the following description numerous specific details are set forth, such as specific circuits, in order to provide a thorough understanding of the present invention. It will be obvious, however, to one skilled in the art that the present invention may be practiced without these specific details. In other instances, well-known circuits are not described in detail in order not to unnecessarily obscure the present invention.

Referring to FIG. 1, a synchronous delay line (SDL) 10 is shown. SDL 10 is comprised of a phase generator 11, a plurality of series coupled voltage-controlled delay (VCD) stages 12, and a sample-and-hold circuit 13. In the example of FIG. 1, circuit 10 is comprised of eight VCD stages 12, wherein each of the VCD stages 12 provides an output which corresponds to the various tap outputs of the SDL 10. It is to be noted that the number of taps available from SDL 10 is a function of the number of VCD stages 12, with such number of stages being a design choice.

The phase generator 11 receives as its input a reference clock signal CLK and divides the frequency of the clock signal CLK by two to generate two 50%-duty-cycle complementary clock phases PHI$_1$ and PHI$_2$. PHI$_1$ and PHI$_2$ are used to control the outputs of the individual VCD stages 12. The clock signal CLK is also coupled as an input to the sample-and-hole circuit 13.

Two additional complementary clock phases PA$_0$ and PB$_0$ are provided as outputs from phase generator 11. Signals PA$_0$ and PB$_0$ are also derived from the reference clock signal CLK and have a 50% duty cycle and are complementary to each other. PA$_0$ and PB$_0$ serve as the trigger inputs to the first VCD stage 12. Although clock phases PHI$_1$ and PHI$_2$ can be used to serve as the trigger inputs to the first VCD stage 12, separate phase signals PA$_0$ and PB$_0$ are utilized since PHI$_1$ and PHI$_2$ are typically slowed by the heavy capacitive loads that they typically must drive.

The various delays of SDL 10 are provided by each of the VCD stages 12. Although a variety of circuits can be implemented for each of the stages 12, one example is described in the aforementioned U.S. Pat. No. 4,496,861. Delay of the timing pulse output from each stage 12, TAP$_n$, is determined by using the following equation:

$$tDEL_n = (n+1)TP/N + t_{ERR} \quad (1),$$

wherein tDEL$_n$ is the delay of the timing pulse output by a given n stage; N is the total number of stages; TP is the period of the clock signal CLK; and t$_{ERR}$ is a small timing error. The tap outputs from each of the VCD stages 12 are provided by exclusively ORing (XORing) the PA$_n$ and PB$_n$ outputs from each VCD stage with the pair of complementary clock phases PHI$_1$ and PHI$_2$. These clock phases are triggered by the reference clock CLK to switch at the start of a new clock cycle when PHI$_1$ and PHI$_2$ are coupled to each of the VCD stages 12. The waveforms are shown in FIG. 2. It is to be noted that in practice a slight time lag exists between the start of the clock signal CLK and the start of PHI, and PHI$_2$, but such lag is not critical to the understanding or practice of the present invention.

When PHI$_1$ and PHI$_2$ switch, all of the SDL 10 taps go inactive. Subsequently, each tap becomes active after a possible delay time determined by Equation 1. The PA$_n$ and PB$_n$ outputs from each stage 12 are coupled as the trigger inputs to its subsequent VCD stage 12. The outputs of the final VCD stage 12 are coupled as inputs to the sample-and-hold circuit 13, as are the clocking signals CLK and PHI$_1$.

The delay of each VCD stage 12 is controlled by an analog control voltage VCTRL, which is generated as an output from the sample-and-hold circuit 13 and coupled back to each VCD stage 12. If VCTRL is high, the delay of the stages 12 is long, while if VCTRL is low, the delay is short. Because SDL 10 is comprised of N identical delay stages, each stages provides a delay equal to 1/N of the overall delay.

The sample-and-hold circuit 13 samples the value of the output voltage of the last VCD stage 12 at the instant that the clock phases PHI$_1$ and PHI$_2$ transition. The delay control voltage VCTRL is provided as a feedback voltage to each of the stages 12 for the purpose of providing the delay control. If the overall delay through SDL 10 is shorter than the clock period TP, a high voltage is sampled at the last VCD stage 12, and, as a consequence, VCTRL increases in its voltage value. Alternatively, if the overall delay through the VCD stages 12 are longer than the clock period TP, a low voltage is sampled at the last VCD stage 12, and, as a consequence, VCTRL decreases in value. When VCTRL decreases in value, the overall delay of the SDL decreases also. A pair of sampling capacitors are typically used to retain the sampled voltage.

Further, as shown in FIG. 1, a reset signal is coupled as an input to the sample-and-hold circuit 13 for resetting the SDL 10. The operation and implementation of SDL 10 is also described in the aforementioned copending application and the aforementioned U.S. Pat. No. 4,496,861, which is hereby incorporated by reference.

A disadvantage of the SDL 10 of FIG. 1 is that the duty cycle of the tap waveforms can be either very small or very large, in comparison to the other taps, for taps that are close to either the beginning or the end of the serial VCD stages 12. Furthermore, the very last tap (TAP$_7$ in FIG. 1) is unusable because it basically has a zero high time, as shown in FIG. 2.

This phenomenon of an unusable last tap is shown in the timing waveform diagram for the eight-tap SDL 10. Various waveforms in FIG. 2 show the relationship of phase signals PHI$_1$, PHI$_2$ and the various tap signals TAP$_{0-7}$ in reference to the reference clock signal CLK. In FIG. 2, the low time 16 of the first tap, TAP$_0$ is short, but the low time period increases with each subsequent tap. For example, low time 17 for TAP$_1$ is longer in duration than low time 16 for TAP$_0$. The low time period commences at each transition of PHI$_1$ and PHI$_2$, and the duration of the low time period will depend on the position of a given tap within the serial VCD stages 12 of SDL 10.

Although the low time 16 of TAP$_0$ is short in duration, its high time 18 is long in comparison. At each subsequent tap, the low time increases in duration while the high time decreases in duration. Thus, the first tap, TAP$_0$, has a very short low time 16, while the last tap, TAP$_7$, has a very short (or non-existent) high time 19.

If the TAP$_n$ low time or high time is too short in duration, then the pulse output by that tap could actually become useless, since in order for the tap pulse to be recognized by conventional metal-oxide-semiconductor (MOS) gates, the pulse must have a minimum low time as well as a minimum high time. With an extremely short low time or high time, the pulse appears like a short "glitch" to an ordinary MOS gate and the gate may not respond to such a glitch. For example, if the tap pulse is used to clock a flip-flop, or alternatively, to load a latch, then the pulse can be too short to be recognized by the flip-flop or the latch. Therefore, it is possible that the first tap or the first few taps, as well as the last tap or the last few taps, may have pulses or insufficient duration for effective use in MOS circuits. It is possible that only taps which are sufficiently located from either end of the synchronous delay line can provide the sufficient low and high time pulses for proper recognition by conventional MOS circuits. As shown in the example of FIG. 2, $TAP_7$ is not usable, because the high time 19 appears as glitches due to insufficient pulse duration.

Another consequence of this phenomenon is that the last VCD stage 12 cannot be tapped at all, because at that point, the high time would actually be zero. Assuming that the last stage is $TAP_7$, this tap will begin to become active at about the time the clock phases $PHI_1$ and $PHI_2$ cause the tap to go inactive. Thus, the high time of the tap would essentially be reduced to zero. Therefore, the last tap, which could provide an additional timing pulse, is made useless when implementing the SDL circuit 10 of FIG. 1 in some instances.

In order to overcome the limitation of the prior art synchronous delay line, the present invention utilizes an additional pair of complementary clock phases which are delayed by one-half ($\frac{1}{2}$) CLK period, so that they are nominally shifted by one-quarter ($\frac{1}{4}$) of a clock-phase period ($PHI_1$ and $PHI_2$). That is, they are equivalent to a 90° phase shift, from the pair of clock-phase periods. Because these new clock phases are nominally shifted by 90° with respect to the clock phases, the new clock phases are referred to as "quadrature" clock phases.

Referring to FIG. 3, a synchronous delay line (SDL) 20 of the present invention is shown. SDL 20 is comprised of a phase generator 21, a plurality of serially arranged voltage-control delay (VCD) stages 22 and a sample-and-hold circuit 23. In the example of FIG. 3, eight VCD stages 22 are shown; however, the actual number of theses VCD stages 22 is a design choice. Each of the VCD stages 22 of FIG. 3 are substantially identical to the VCD stages 12 of FIG. 1, so that the various tap outputs provide the respective delay determined by equation 1.

Furthermore, as was the arrangement in FIG. 1, two clock pulses $PA_0$ and $PB_0$ are generated from the phase generator 21 and are coupled to the first VCD stage 22. The clocking outputs from each VCD stage 22 (shown as $PA_n$ and $PB_n$) are subsequently coupled as clock phase inputs to the subsequent stages. Each of the VCD stages 22 receives clock phase inputs (shown as SA and SB), as well as the VCTRL signal which is output from the sample-and-hold circuit 23 for controlling the delays of the various outputs from each of the VCD stages 22. A reference clock signal CLK is coupled as an input to the phase generator 21, as well as to the sample-and-hold circuit 23. These aspects of the SDL 20 of FIG. 3 are substantially equivalent to those of the SDL 10 of FIG. 1.

However, unlike the prior art SDL 10 of FIG. 1, the SDL 20 of the present invention has a phase generator which generates two pairs of complementary clock phases, $PHI_1/PHI_2$ and $PHIQ_1/PHIQ_2$. The phase generator 21 accepts the reference clock signal CLK and provides a frequency division operation. Although the phase generator 21 of the preferred embodiment divides the clock frequency by a factor of two, the actual division factor, if any, is strictly a design choice.

The in-phase clock signals $PHI_1$ and $PHI_2$, are complementary to each other and, further, are in phase with the reference clock signal CLK. It is to be appreciated that in actual practice a slight time lag may exist between the reference clock CLK and phase clock signals $PHI_1$ and $PHI_2$, but, as was the case in FIG. 1 and 2, such lag is not critical to the workings of the present invention. Clock phases $PHIQ_1$ and $PHIQ_2$ are complementary to each other but are not in phase with the reference clock signal CLK. The quadrature clock phases $PHIQ_1$ and $PHIQ_2$ are shifted by approximately 90° with respect to the phase of the original clock signal CLK, as well as the in-phase clock phases $PHI_1$ and $PHI_2$. The timing of the various clock signals is illustrated in FIG. 4. The clock signal CLK has a predetermined frequency, such that the period of CLK is designated as TP. Because of the divide-by-two operation by phase generator 21, each of the clock phases $PHI_1$ and $PHI_2$ has its positive portion of its pulse as period TP and its negative pulse portion also as period TP. $PHIQ_1$ is a replication of clock phase $PHI_1$, except that $PHIQ_1$ is shifted a predetermined number of degrees from $PHI_1$. Equivalently, $PHIQ_2$ is a replication of the signal $PHI_2$, except that it is shifted by a predetermined number of degrees from $PHI_2$. In the preferred embodiment the predetermined shift is approximately 90°.

Referring to FIGS. 3 and 4, phases $PHI_1$ and $PHI_2$ are coupled to the interior VCD stages 22. In this particular example, $PHI_1$ and $PHI_2$ signals are coupled to VCD stages corresponding to $TAP_2$–$TAP_5$. The quadrature phase signals $PHIQ_1$ and $PHIQ_2$ are coupled to the VCD stages 22 at the two extremities. In the example, $PHIQ_1$ and $PHIQ_2$ are coupled to the VCD stages corresponding to $TAP_0$, $TAP_1$, $TAP_6$ and $TAP_7$.

The results of using quadrature phases for the VCD stages at the extremities of the delay line is exemplified in the waveform diagram of FIG. 4. Because of the use of the quadrature clock phases, taps at the extremities provide signals which do not have such a disparity between the positive and negative going portions. For example, in FIG. 2, where the negative portion 16 of the waveform of $TAP_0$ is narrow in comparison to the positive portion 18, such disparity is removed in the waveform of $TAP_0$ in FIG. 4. Such differences are noticeable when $TAP_0$ waveforms are referenced to time period TP.

A further advantage is noted when comparing $TAP_7$ of the present invention to $TAP_7$ of FIG. 2. In the prior art SDL 10, $TAP_7$ provides glitches 19 which are basically not usable. However, $TAP_7$ of the present invention provides a signal having positive and negative portions of sufficient duration for MOS applications. That is, in the prior art, $TAP_7$ typically was not usable due to the generation of glitches 19. However, the glitches are cured with the quadrature clock phase technique of the present invention. Whereas the taps at the extremities of the prior art SDL 10 either provides unusable pulses or pulses of short duration, SDL 20 of the present invention, by using the quadrature phasing technique, provides for the taps at the extremities of the delay line to generate pulses having sufficient positive and negative durations.

Although the actual number of VCD stages 22 at the extremities of the delay line can be driven by the quadrature clock phases, it has been determined that a particular implementation is preferred. As a rule of thumb, the quadrature phases $PHIQ_1$ and $PHIQ_2$ are used for switching $\frac{1}{8}$–$\frac{1}{4}$ of the taps that are at the beginning of the delay line and $\frac{1}{8}$–$\frac{1}{4}$ of the taps that are at the end of the delay line. However it is to be appreciated that this rule can be readily modified without departing from the spirit and scope of the present invention.

It is to be noted that SDL 20 of FIG. 3 is shown to have $PHIQ_1$ coupled to the SA input of the even-numbered VCD stages 22 at the beginning of the SDL and to the SA input of the odd-numbered VCD stages 22 at the end of the SDL. Conversely, PHIQ$_2$ is coupled to the SB input of the even-numbered VCD stages 22 at the beginning of the SDL and to the SB input of the odd-numbered VCD stages 22 at the end of the SDL. Furthermore, PHI$_1$ is coupled to the SA input of the even-numbered VCD stages 22 in the middle of the SDL, while, conversely, PHI$_2$ is coupled to the SA input of the odd-numbered VCD stages 22 in the middle of the SDL.

This alternating sequence of clock phases is provided to the various VCD stages 22 of FIG. 3, because the alternate phase clocking is needed to switch the various tap stages when using a particular VCD circuit of the preferred embodiment as shown in FIG. 5. However, it is to be appreciated that other arrangements of VCD stages 22 can be used to practice the present invention without departing from the spirit and scope of the present invention and that the actual phasing inputs will depend upon the particular VCD circuit chosen.

Referring to FIG. 5, a phase generator circuit 21 of the preferred embodiment for generating the various clocking signals is shown. Phase generator 21 is comprised of there flip-flops 31–33 and a plurality of inverters 34. Flip-flops 31 and 32 are D-type level-triggered flip-flops and are coupled to operate as a master and slave, respectively. Flip-flop 33 is a D-type edge-triggered flip-flop; internally, flip-flop 33 is constructed as a master-slave pair like flip-flops 31 and 32. The output of flip-flop 31 provides the PHIQ$_1$ output, as well as the input to flip-flop 32. The Q/ (/ is hereinafter used to denote a complement) output of flip-flop 31 is used to provide the PHIQ$_2$ output. The PHI$_1$ output is provided by the Q output of the slave flip-flop 32, while the PHI$_2$ output is provided by the Q/ output of slave flip-flop 32. The PA$_0$ and PB$_0$ signals are provided from the Q and Q/ outputs of the D-type flip-flop 33, respectively.

Each of the Q and Q/ outputs from flip-flops 31 and 32 are coupled through a dual inverter stage, shown comprised of inverters 34, for the purpose of buffering the outputs. The buffered PHI$_2$ output is coupled back as the D input to flip-flops 31 and 33. The reference clock signal CLK is coupled to the clock inputs of the three flip-flops 31–33 for the purpose of providing triggering to the flip-flops. The outputs from the master flip-flop 31 provides for a nominal shift of 90° with respect to the outputs from the slave flip-flop 32. The 90° shift occurs when the duty cycle of the reference clock signal CLK is at 50%. If the duty cycle of CLK is not 50%, then the shift is either less than or more than 90° depending on the duty cycle. It is to be noted that the actual amount of the shift is not critical to the practice of the present invention, as long as the shift provides for sufficient low and high times for the respective tap outputs of the SDL. Further, because the PA$_0$ and PB$_0$ outputs are derived from the outputs of flip-flop 33, PA$_0$ and PB$_0$ are approximately in phase with the PHI$_1$ and the PHI$_2$ signals. It is to be appreciated that although a specific clock circuit for generating the various clocking signals is shown in FIG. 5, other clocking schemes can be readily implemented to function as the phase generator 21 of the preferred embodiment.

Referring to FIG. 6, a VCD stage 22 of the preferred embodiment is shown implementing a complementary metal-oxide-semiconductor (CMOS) technology. However, it is to be appreciated that a variety of circuits can be implemented for the VCD stage 22 in the practice of the present invention without departing from the spirit and scope of the present invention. In each stage 22, PA and PB inputs are coupled in as input A and input B, respectively, to a cross-coupled NAND gate pair, wherein the output of NAND gate A provides output A, and the output of NAND gate B provides output B. The output of NAND gate A, referenced as node 38, is coupled to a pair of CMOS capacitors 39, while the output of NAND B, referenced as node 40, is coupled to a pair of CMOS capacitors 41.

The delay of each VCD stage 22 is controlled by an analog control voltage VCTRL, which is generated by the sample-and-hold circuit 23, and which is coupled to control the coupling of node 38 to capacitors 39 and also node 40 to capacitors 41. The control voltage VCTRL controls the SDL 20 delay by causing the transition times of the cross-coupled NAND gates A and B to be long for NAND gate output voltages that are less than or equal to VCTRL minus VT, and to be short for output voltages that are greater than VCTRL minus VT. Voltage VT is the threshold voltage of each of the N-type pass devices 42 and 43 which couples the appropriate NAND gate outputs to its load capacitors 39 or 41, respectively. For NAND gate output voltages that are less than VCTRL minus VT, the NAND gate outputs are fully loaded down by the capacitors. Alternatively, for NAND gate output voltages that are greater than VCTRL minus VT, the capacitors are effectively disconnected from the NAND gate output nodes. By varying VCTRL, the fraction of a NAND gate output transition during which the output is fully loaded down by the load capacitors is varied. The greater the fraction of a transition during which the output is fully loaded down, the longer the overall transition time. Either the output node 38 or 40 is coupled as the tap output, wherein the state of the clock signals coupled to SA and SB inputs determines which node is coupled as the tap output. The complementary clock phasing signals PHI$_1$/PHI$_2$ or PHIQ$_1$/PHIQ$_2$ are provided as inputs SA and SB as shown in FIG. 3. Each controls a pair of CMOS pass devices 46 and 47, such that when the input to SA is high and the input to SB is low, the output of NAND A is coupled as the tap output through inverter buffer 48. Alternatively, when the input to SA is low and the input to SB is high the output of NAND gate B is coupled as the tap output. The outputs A and B are coupled as PA and PB signals to the next stage.

Referring to FIG. 7, a portion of the sample-and-hold circuit 23 of the preferred embodiment is shown. Circuit 45 is implemented using CMOS technology in the preferred embodiment; however, it is to be appreciated that other circuits can be readily used without departing from the spirit and scope of the present invention. Circuit 45 samples the values of the output voltage PA$_n$ and PB$_n$ of the last VCD stage 22 at the instant that the clock phases, SPHI$_1$ and SPHI$_2$ and their complements make a transition. The sample-and-hold clock phasing signals SPHI$_1$ and SPHI$_2$ and their complements SPHI$_1$/ and SPHI$_2$/, are generated within the sample-and-hold circuit 23. SPHI$_1$ is basically a replication of the clock phase signal PHI$_1$ and SPHI$_2$ which is a replication of the clock phase signal PHI$_2$. As shown in FIG. 7, these sample-and-hold clock phase signals are used to pass each of the input signals PA and PB of the last stage 22 of SDL 20 to provide the VCTRL signal at the output of circuit 45. Input PA$_n$ is passed through an inverter buffer 50 which output is then coupled to a pair of CMOS capacitors 51 through CMOS pass devices 52 controlled by SPHI$_2$ and SPHI$_2$/. The pair of capacitors 51 are coupled to a pair of CMOS output capacitors 55 through CMOS pass devices 53 which are controlled by $SPHI_1$ and $SPHI_1/$.

Equivalently, $PB_n$ is coupled through an inverter buffer 60 which output is then coupled to a pair of CMOS capacitors 61 through CMOS pass devices 62 which are controlled by $SPHI_1$ and $SPHI_1/$. Capacitors 61 are coupled through CMOS pass devices 63 to the CMOS capacitors 55. Pass devices 63 are controlled by $SPHI_2$ and $SPHI_2/$. The output capacitors 55 are also a CMOS pair, and the values of the capacitors 55 are much larger in size as compared to capacitors 51 and 61. Capacitors 51 have values identical to those of capacitors 61. The sample-and-hold clock phasing signals $SPHI_1$, $SPHI_1/$, $SPHI_2$ and $SPHI_2/$ are non-overlapping signals which are used to open and close the pass devices 52, 53, 62 and 63 so that proper timing is provided for transferring the input signals to the output without any overlap occurring. That is, when devices 52 are open for passing the PA signal to capacitors 51 for the purpose of charging up capacitors 51, the clock phases prevent the passage of this voltage to the output capacitors 55 due to the fact that devices 53 are closed. During this time period when devices 52 allow the passage of signal PA to charge capacitors 51, devices 63 are open permitting capacitors 61 to be coupled to the output capacitors 55.

Alternatively, when devices 62 are open allowing the signal PB to charge capacitors 61, devices 63 ensure that capacitors 61 are isolated from the output capacitors 55. However, during this period, devices 53 are open allowing capacitors 51 to discharge and charge capacitors 55. Therefore, the sampled voltage is held on the smaller sampling capacitors 51 and 61 at corresponding times, and on the following clock phase the corresponding sampling capacitors are coupled to the output capacitors 55. Capacitors 55 operate as a second sampling capacitor, but having a much larger size than the first set of capacitors 51 or 61. On account of the large ratio in size of the output capacitors 55 to either of the first pair of capacitors 51 or 61, the voltage of the second capacitor charges only slightly, even for a large sampled voltage on the first set of capacitors. Thus, the sampled voltage is effectively attenuated as a result of the large size ratio of the capacitors. This attenuation is used in order to guarantee stable SDL operation. Without the attenuation, the SDL feedback could become positive under certain conditions and cause unstable operation, such as oscillation.

The attenuated voltage is then fed back to each of the VCD stages 22 as the delay control voltage VCTRL. If the overall delay through the VCD stages is shorter than the clock period TP, a high voltage is sampled from the last VCD stage 22. As a consequence, VCTRL increases, causing the overall delay of the VCD stages to increase also. Over several clock periods, the overall delay through the VCD stages gradually increases until the delay just equals the clock period TP. Alternatively, if the overall delay through the VCD stages 22 is longer than the clock period TP, a low voltage is sampled from the last VCD stage 22 of SDL 20. As a consequence, VCTRL decreases, causing the overall delay of the VCD stages to decrease also. Again, over several clock periods, the overall delay through the VCD stages 22 will gradually decrease until the delay just equals the period TP. Thus, whether the overall delay through the VCD stages is greater than or less than the clock period TP, the VCD delay corrects itself through the negative feedback provided by VCTRL, until the overall delay just equals TP. In the preferred embodiment, $SPHI_1$ and $SPHI_2$ and their complements are obtained from the signal $PHI_1$ coupled from the phase generator. Because $PHI_2$ is a complement of $PHI_1$, it need not be provided by phase generator 21 to sample-and-hold circuit 23; however it could readily be so provided. It is to be appreciated that other techniques can be readily implemented to generate these sample-and-hold clock phasing signals.

Referring to FIG. 8, sample-and-hold waveforms $SPHI_1$, $SPHI_1/$, $SPHI_2$ and $SPHI_2/$ are shown in respect to the clock signal CLK and the phasing signals $PHI_1$ and $PHI_2$. It is to be noted that in order to prevent the overlapping from occurring in passing the signal through the various pass devices 52, 53, 62 and 63, a slightly non-uniform (not 50%) duty cycle is used for the sample-and-hold phasing signals. The duty cycles of the portion of the waveforms which activate these various devices 52, 53, 62 and 63 are less than 50%, such that the positive portion 70 of the $SPHI_1$ waveform and the negative going portion 71 of the $SPHI_1/$ waveform activates pass devices 62 and 53 for less than 50% of the cycle. That is, the pulse width is less than the duration TP. Likewise, the positive going portion 72 of $SPHI_2$ and the negative going portion 73 of $SPHI_2/$, which are used to activate devices 52 and 63 are also of a duration less than the period TP.

Thus a synchronous delay line with quadrature clock phases is described.

I claim:

1. An integrated circuit delay line apparatus for generating at least one delayed signal synchronized with a reference signal, comprising:
    a plurality of delay means serially coupled, wherein each of said delay means for providing a controllable delay, and each of said delay means coupled to receive a control signal for controlling the durations of said delays;
    a phase generation means coupled to receive said reference signal and for generating a first phasing signal which is substantially in phase with said reference signal and for generating a second phasing signal which is approximately 90° out of phase with said first phasing signal;
    said first phasing signal coupled to some of said delay means and said second phasing signal coupled to others of said delay means;
    control signal generating means coupled to receive a delayed reference signal from the last one of said sequentially coupled delay means and for generating said control signal;
    wherein the use of said first and second phasing signals provides that an output from each of said delay means has a duty cycle which is operable with metal-oxide-semiconductor (MOS) circuits.

2. The integrated circuit delay line apparatus defined by claim 1, wherein said control signal generation means comprises a sample-and-hold circuit for generating an analog voltage to control said delay of said delay means.

3. The integrated circuit delay line apparatus of claim 2, wherein said first phasing signal is coupled to interior delay means while said second phasing signal is coupled to delay means disposed at extremities of said delay line.

4. The integrated circuit delay line apparatus of claim 3, wherein said phase generation means includes a divide-by-two circuit for dividing said reference signal to provide said first and second phasing signals.

5. The integrated circuit delay line apparatus of claim 4, wherein each of said delay means provides a time delay of equal duration.

6. An integrated circuit delay line apparatus for generating at least one delayed synchronized with a clocking signal, comprising:
   a plurality of delay means, each for providing a controllable delay, each of said delay means coupled to receive a control signal for controlling the duration of said delays;
   a phase generation means coupled to receive said clocking signal and for generating a reference signal, a first phasing signal which is substantially in phase with said reference signal, and a second phasing signal which is approximately 90° out of phase with said first phasing signal;
   first of said delay means being coupled to receive said reference signal, each of the remaining said delay means being sequentially coupled to receive the delayed reference signal coupled to others of said delay means;
   control signal generation means for generating said control signal, said control signal generation means coupled to receive said delayed reference signal from the last one of said sequentially coupled delay means; and
   tap means for tapping at least one delayed reference signal by use of said phasing signals, such that the use of said phasing signals provides for outputs from said delay means to have sufficient duty cycle in order that said outputs are operable with metal-oxide-semiconductor (MOS) circuits.

7. The integrated circuit delay line apparatus defined by claim 6, wherein said control signal generation means comprises a sample-and-hold circuit for generating an analog voltage to control said delay of said delay means.

8. The integrated circuit delay line apparatus of claim 7, wherein said first phasing signal is coupled to interior delay means while said second phasing signal is coupled to delay means disposed at extremities of said delay line.

9. The integrated circuit delay line apparatus of claim 8, wherein said phase generation means includes a divide-by-two circuit for dividing said clocking signal to provide said first and second phasing signals.

10. The integrated circuit delay line apparatus of claim 9, wherein each of said delay means provides a time delay of equal duration.

11. An integrated circuit delay line apparatus for generating at least one delayed signal synchronized with a clocking signal, comprising:
    a plurality of delay means, each for providing a controllable delay, each of said delay means coupled to receive a control signal for controlling the duration of said delays;
    a phase generation means coupled to receive said clocking signal and for generating a reference signal and its complement, a first phasing signal and its complement which are substantially in phase with said reference signal, and a second phasing signal and its complement which are out of phase with said first phasing signal and its complement by a predetermined number of degrees;
    first of said delay means being coupled to receive said reference signal and its complement, each of the remaining said delay means being sequentially coupled to receive the delayed reference signal and its complement from a previously coupled delay means;
    said first phasing signal and its complement coupled to some of said delay means and said second phasing signal and its complement coupled to others of said delay means;
    control signal generation means for generating said control signal, said control signal generation means coupled to receive said delayed reference signal and its complement from the last one of said sequentially coupled delay means; and
    tap means for tapping at least one delayed reference signal by use of one of either said first, second phasing signals or their complements said phasing signals, such that the use of said phasing signals provides for each output from said delay means to have sufficient positive and negative going portions of its waveform in order that each said output is operable with metal-oxide-semiconductor (MOS) circuits.

12. The integrated circuit delay line apparatus defined by claim 11, wherein said second phasing signal and its complement are approximately 90° out of phase to said first phasing signal and its complement.

13. The integrated circuit delay line apparatus defined by claim 12, wherein said control signal generation means comprises a sample-and-hold circuit for generating an analog voltage to control said delay of said delay means.

14. The integrated circuit delay line apparatus of claim 13, wherein said first phasing signal and its complement are coupled to interior delay means while said second phasing signal and its complement are coupled to delay means disposed at extremities of said delay line.

15. The integrated circuit delay line apparatus of claim 14, wherein said phase generation means includes a divide-by-two circuit for dividing said clocking signal to provide said first and second phasing signal and their complements.

16. The integrated circuit delay line apparatus of claim 15, wherein each of said delay means provides a time delay of equal duration.

17. An integrated circuit delay line apparatus for generating at least one delayed signal synchronized with a clocking signal, comprising:
    a plurality of delay means, each for providing a controllable delay, each of said delay means coupled to receive a control signal for controlling the duration of said delays;
    a phase generation means coupled to receive said clocking signal for generating a first phasing signal and a second phasing signal, said first and second phasing signals being out of phase with one another by a predetermined number of degrees;
    said first phasing signal coupled to only some of said delay means and said second phasing signal coupled only to other of said delay means.

18. The integrated circuit delay line apparatus defined by claim 17 wherein said second phasing signal is approximately 90° out of phase with respect to said first phasing signal.

* * * * *

UNITED STATES PATENT AND TRADEMARK OFFICE
CERTIFICATE OF CORRECTION

PATENT NO. : 4,994,695

DATED : February 19, 1991

INVENTOR(S) : Mel Bazes

It is certified that error appears in the above-identified patent and that said Letters Patent is hereby corrected as shown below:

Column 3, line 58, delete "possible" insert --precise--.

Signed and Sealed this

Seventeenth Day of August, 1993

Attest:

BRUCE LEHMAN

Attesting Officer     Commissioner of Patents and Trademarks